United States Patent
Xu

(10) Patent No.: US 8,053,299 B2
(45) Date of Patent: Nov. 8, 2011

(54) METHOD OF FABRICATION OF A FINFET ELEMENT

(75) Inventor: Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/425,854

(22) Filed: Apr. 17, 2009

(65) Prior Publication Data

US 2010/0264468 A1    Oct. 21, 2010

(51) Int. Cl.
H01L 29/78 (2006.01)
(52) U.S. Cl. ............ 438/197; 438/478; 257/E29.255
(58) Field of Classification Search ........... 438/478, 438/197; 257/E21.002
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2006/0281234 A1 | 12/2006 | Sugiyama et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2007/0241399 A1* | 10/2007 | Irisawa et al. | 257/347 |
| 2008/0237575 A1* | 10/2008 | Jin et al. | 257/19 |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2010/0006945 A1 | 1/2010 | Merelle et al. | |
| 2010/0006974 A1 | 1/2010 | Xu et al. | |
| 2010/0052059 A1 | 3/2010 | Lee | |
| 2010/0163838 A1* | 7/2010 | Chu-Kung et al. | 257/9 |
| 2010/0183961 A1 | 7/2010 | Shieh et al. | |
| 2010/0203734 A1 | 8/2010 | Shieh et al. | |

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

Primary Examiner — Evan Pert
Assistant Examiner — Selim Ahmed
(74) Attorney, Agent, or Firm — Haynes and Boone, LLP

(57) ABSTRACT

The present disclosure provides a FinFET element and method of fabricating a FinFET element. The FinFET element includes a germanium-FinFET element (e.g., a multi-gate device including a Ge-fin). In one embodiment, the method of fabrication the Ge-FinFET element includes forming silicon fins on a substrate and selectively growing an epitaxial layer including germanium on the silicon fins. A Ge-condensation process may then be used to selectively oxidize the silicon of the Si-fin and transform the Si-fin to a Ge-fin. The method of fabrication provided may allow use of SOI substrate or bulk silicon substrates, and CMOS-compatible processes to form the Ge-FinFET element.

15 Claims, 8 Drawing Sheets

OTHER PUBLICATIONS

Hsien-Hsin Lin, et al., U.S. Appl. No. 12/703,918, "Method for Fabricating a Finfet Device," filed Feb. 11, 2010, 40 pages.
Chien-Chang Su, et al., U.S. Appl. No. 12/644,869, "Method For Incorporating Impurity Element In EPI Silicon Process," filed Dec. 22, 2009, 21 pages.
Tsung-Lin Lee, et al., U.S. Appl. No. 12/622,038, "Sacrificial Offset Protection Film For A Finfet Device," filed Nov. 19, 2009, 56 pages.
Jeff J. Xu, et al., U.S. Appl. No. 12/784,207, "Method of Forming EPI Film In Substrate Trench," filed May 20, 2010, 33 pages.
Tian-Choy, et al., U.S. Appl. No. 12/756,552, "Hybrid Gate Process For Fabricating Finfet Device," filed Apr. 8, 2010, 38 pages.
Ming-Lung Cheng, et al. U.S. Appl. No. 12/780,124, "Method And Apparatus For Enhancing Channel Strain," filed May 14, 2010, 35 pages.
Jhon Jhy Liaw, U.S. Appl. No. 12/823,907, "Cell Structure for Dual-Port SRAM," filed Jun. 25, 2010, 46 pages.
Jhon Jhy Liaw, U.S. Appl. No. 12/827,406, "Rom Cell Circuit For Finfet Devices," filed Jun. 30, 2010, 32 pages.
Jhon Jhy Liaw, U.S. Appl. No. 12/823,860, "Structure And Method For SRAM Cell Circuit," filed Jun. 25, 2010, 37 pages.
Jhon Jhy Liaw, et al., U.S. Appl. No. 12/827,690, "Layout For Multiple-Fin SRAM Cell," filed Jun. 30, 2010, 35 pages.
Jeng-Jung Shen, et al., U.S. Appl. No. 12/780,060, "Automatic Layout Conversion For Finfet Device," filed May 14, 2010, 29 pages.
Jeng-Jung Shen, et al., U.S. Appl. No. 12/780,426, "Finfet Boundary Optimization," filed May 14, 2010, 28 pages.
Yu-Lien Huang, et al., U.S. Appl. No. 12,840,830, "High Surface Dopant Concentration Semiconductor Device And Method Of Fabricating," filed Jul. 21, 2010, 21 pages.

Peng-Soon Lim, et al., U.S. Appl. No. 12/827,512, "Gate Structures And Method Of Fabricating Same," filed Jun. 30, 2010, 41 pages.
Tsu-Hsiu Perng, et al., U.S. Appl. No. 12/837,093, "Fin-Like Field Effect Transistor (Finfet) Device And Method Of Manufacturing Same," filed Jul. 15, 2010, 30 pages.
Clement Hsingjen Wann, et al., U.S. Appl. No. 12/834,617, "In-Situ Spectrometry," filed Jul. 12, 2010, 20 pages.
Chia-Chung Chen, et al., U.S. Appl. No. 12/871,476, "Gate Controlled Bipolar Junction Transistor On Fin-Like Field Effect Transistor (Finfet) Structure," filed Aug. 30, 2010, 30 pages.
Jeff J. Xu, et al, U.S. Appl. No. 12/906,820, "Fin-Like Field Effect Transistor (Finfet) Device And Method Of Manufacturing Same," filed Oct. 18, 2010, 55 pages.
Jeff J. Csu, et al, U.S. Appl. No. 12/917,902, "Fin-Like Field Effect Transistor (FINFET) Device And Method Of Manufacturing Same," filed Nov. 2, 2010, 61 pages.
Mark van Dal, U.S. Appl. No. 12/900,895, "Method Of Fabricating A Semiconductor Device Having An Epitaxly Region," filed Oct. 8, 2010, 21 pages.
Hsin-Chih Chen, et al, U.S. Appl. No. 12/907,272, "Multi-Fin Device By Self-Aligned Castle Fin Formation," filed Oct. 19, 2010, 34 pages.
Chien-Hsun Wang, et al, U.S. Appl. No. 12/952,376, "Method For Adjusting Fin Width In Integrated Circuitry," filed Nov. 23, 2010, 27 pages.
Chien-Shun Wang, et al, U.S. Appl. No. 12/949,881, "Method For Forming Metrology Structures From Fins In Integrated Circuitry," filed Nov. 19, 2010, 16 pages.
Chien-Hsun Wang, et al, U.S. Appl. No. 12/953,148, "Device and Method For Forming Fins In Integrated Circuitry," filed Nov. 23, 2010, 39 pages.

* cited by examiner

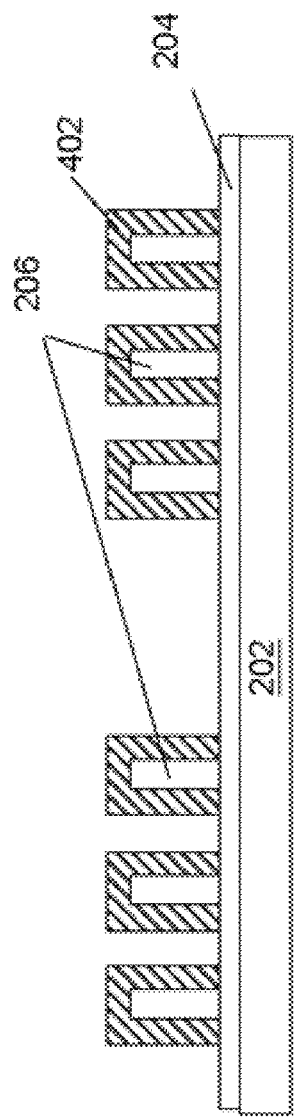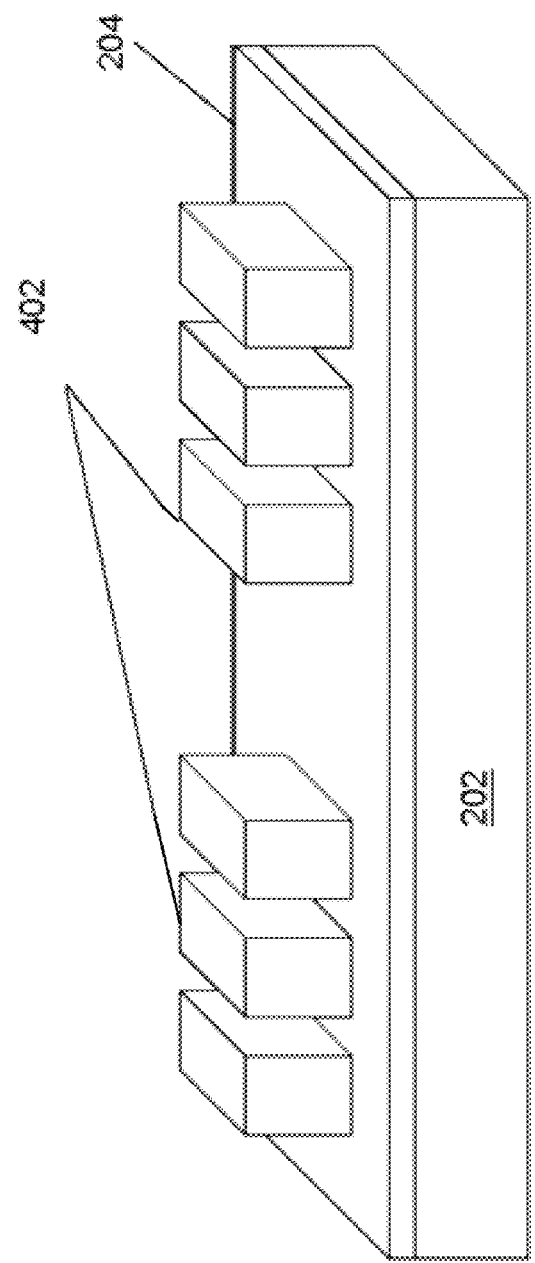

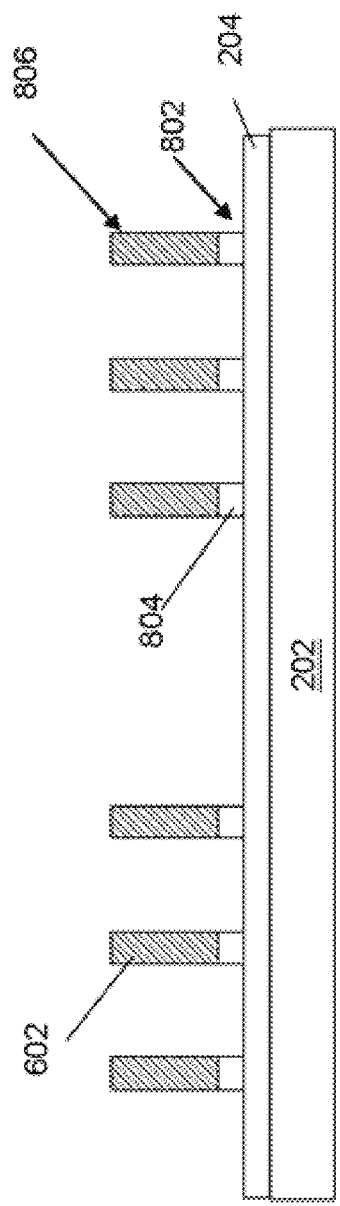
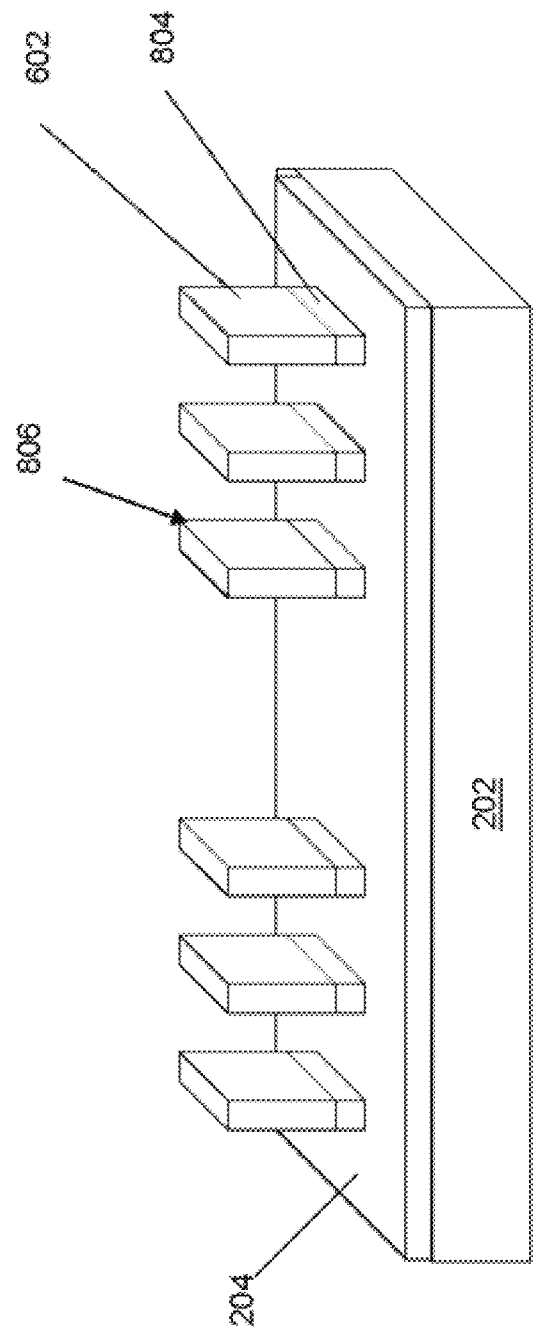

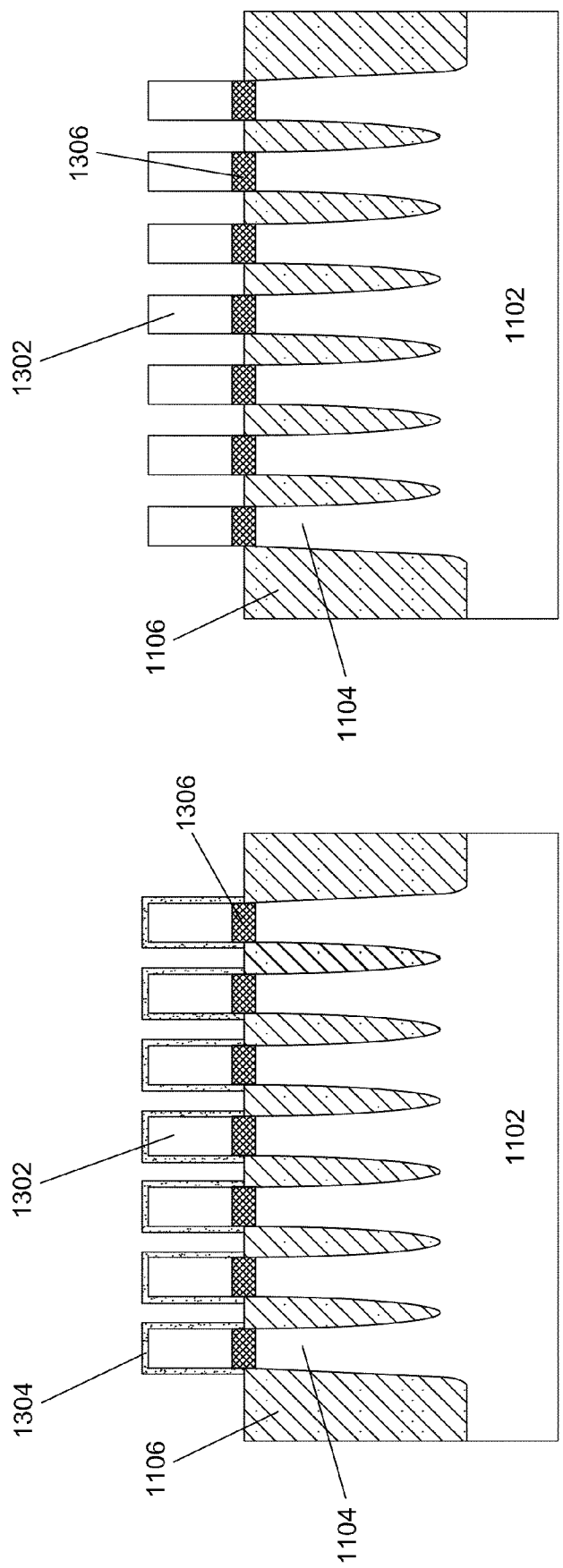

METHOD OF FABRICATION OF A FINFET ELEMENT

BACKGROUND

The present disclosure relates generally to the field of fabrication of semiconductor devices, and more specifically to a method of fabricating a fin type field effect transistor (FinFET) or portion thereof.

Double-gate MOSFETs are MOSFETs that incorporate two gates into a single device. These devices are also known as FinFETs due to their structure including a thin "fin" extending from a substrate. Silicon based FinFETs have been successfully fabricated using conventional MOSFET technology. A typical FinFET is fabricated on a substrate with an overlying insulating layer with a thin 'fin' extending from the substrate, for example, etched into a silicon layer of the substrate. The channel of the FET is formed in this vertical fin. A gate is provided over (e.g., wrapping) the fin. The double gate is beneficial in that there is a gate on both sides of the channel allowing gate control of the channel from both sides. Further advantages of FinFETs include reducing the short channel effect and higher current flow. Other FinFET architectures may include three or more effective gates.

Germanium FinFET (Ge-FinFET) fabrication has provided numerous difficulties however. Ge-FinFET devices include a fin formed at least in part, of germanium (as opposed to silicon fin). Typical Ge-FinFET fabrication includes patterning a germanium layer on a germanium-on-insulator (GOI) substrate to form a narrow Ge-fin. However, GOI substrates are not widely used in production processes. Furthermore, GOI substrates may provide issues with crystalline quality particularly at larger wafer sizes, for example, 300 mm wafers. Further still, the GOI etch process will require extensive development in order to make it suitable for production fabrication processes. In contrast, silicon based FinFET processes have been well developed.

As such, an improved Ge-FinFET device and fabrication method of a FinFET element is desired.

SUMMARY

In one embodiment, a method of fabricating a FinFET element is provided. A substrate is provided and a plurality of fins is formed on the substrate. An epitaxial layer is grown on the fins. The epitaxial layer includes germanium. A germanium condensation process is performed. The germanium condensation process transfers germanium from the epitaxial layer to the fins to form germanium fins (Ge-fins). In an embodiment, the epitaxial layer is SiGe. In an embodiment, the Ge-condensation process consumes silicon in the plurality of fins and/or the epitaxial layer to form a silicon oxide layer overlying the fins. As the silicon is consumed, the germanium may be transferred to the center of the structure and a Ge-fin formed.

In another embodiment, a method of fabricating a semiconductor device is provided. A substrate is provided and a silicon fin is formed on the substrate. In an embodiment, the substrate is an SOI substrate. In an embodiment, the substrate is a bulk silicon substrate. A layer (e.g., an epi layer) is formed on the silicon fin. The layer includes germanium. The silicon fin is transformed to a germanium fin. The transforming of the fin includes performing an oxidation to consume silicon of the silicon fin. The consumed silicon forms a silicon oxide layer. In an embodiment, the silicon oxide layer is removed. The oxidation used to transform the silicon fin may be continued until a desired composition of Ge-fin is reached. In an embodiment, a substantially pure (e.g., only Ge) fin is provided.

In an embodiment, a FinFET device is provided. The FinFET includes a substrate and a fin structure disposed on the substrate. The fin structure includes an upper portion and a lower portion. The upper portion includes germanium. In an embodiment, the upper portion includes a Ge-fin formed using a Ge-condensation process. The lower portion includes an insulating material. In an embodiment, the lower portion is silicon oxide. In an embodiment, the lower portion is formed during a wet etch following a Ge-condensation process used to form the upper portion of the fin structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 4, 6, and 8 are cross-sectional views illustrating an embodiment of a substrate corresponding to one or more steps of the method of FIG. 1.

FIGS. 3, 5, 7, and 9 are perspective views illustrating an embodiment of a substrate corresponding to the cross-sectional views of FIGS. 2, 4, 6, and 8.

FIGS. 11, 12, 13, and 14 are cross-sectional views illustrating an embodiment of a bulk silicon substrate corresponding to one or more steps of the method of FIG. 1.

DETAILED DESCRIPTION

The present disclosure relates generally to semiconductor devices and more particularly, to a FinFET element and method of fabricating a FinFET element (e.g., device or portion of a device). It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact. FinFET device as the term is employed in the current disclosure provides any fin-based, multi-gate transistor. A FinFET element may include a FinFET device (e.g., transistor) or any portion thereof (e.g., a fin). In addition, though described herein as Ge-FinFET elements, one skilled in the art would recognize the applicability of the present disclosure to other chemical composition FinFETs.

Figure 1:
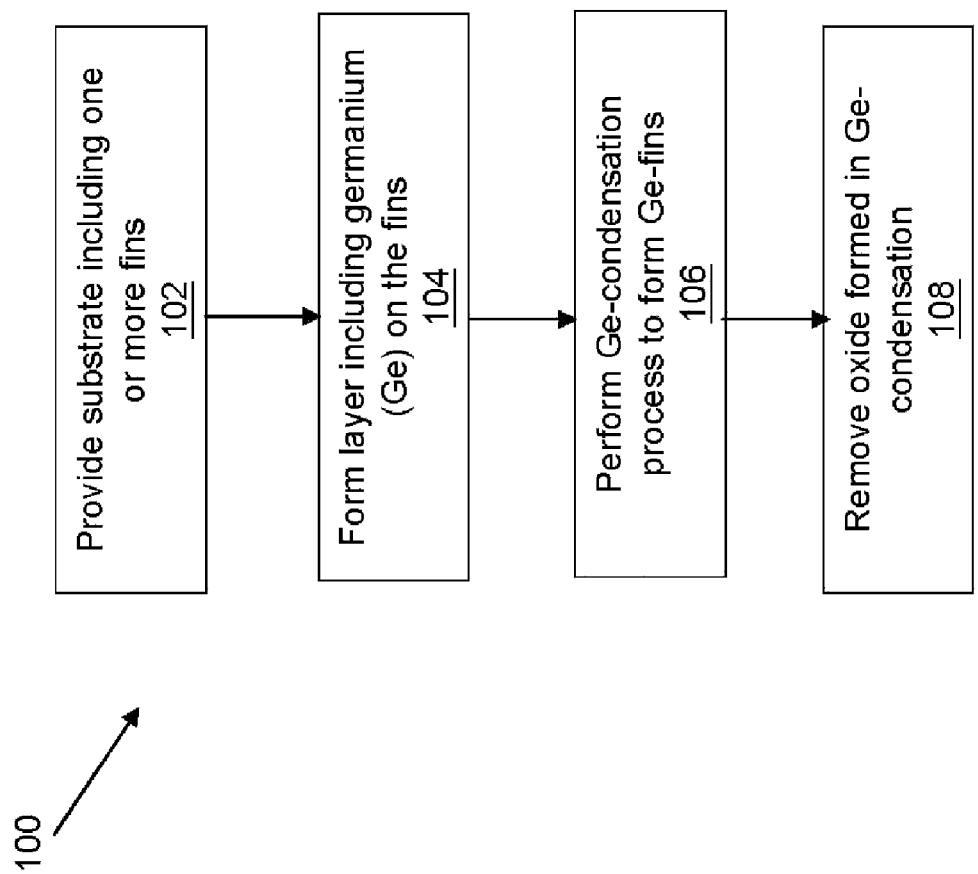
FIG. 1 is flowchart illustrating an embodiment of a method of fabricating a Ge-FinFET element.

Referring to FIG. 1, illustrated is an embodiment of a method of fabricating a Ge-FinFET element. The method begins at step 102 where a substrate including one or more fins is provided. In an embodiment, the substrate includes a silicon substrate (e.g., wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate. The SOI substrate may be fabricated using separation by implantation of oxygen (SIMOX), wafer bonding, and/or other suitable methods. In an embodiment, the fins are silicon fins (Si-fins). The fins may be formed, for example, by etching a layer of silicon on the substrate. The layer of silicon may be a silicon layer of an SOI substrate (e.g., overlying an insulator layer).

Figure 2:
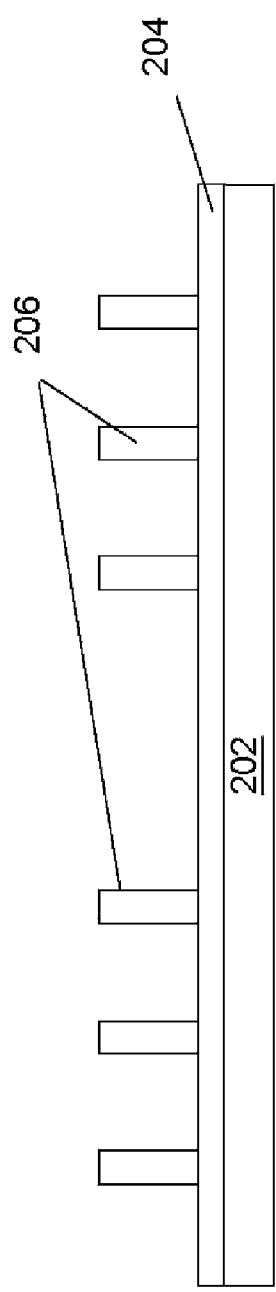
Figure 3:
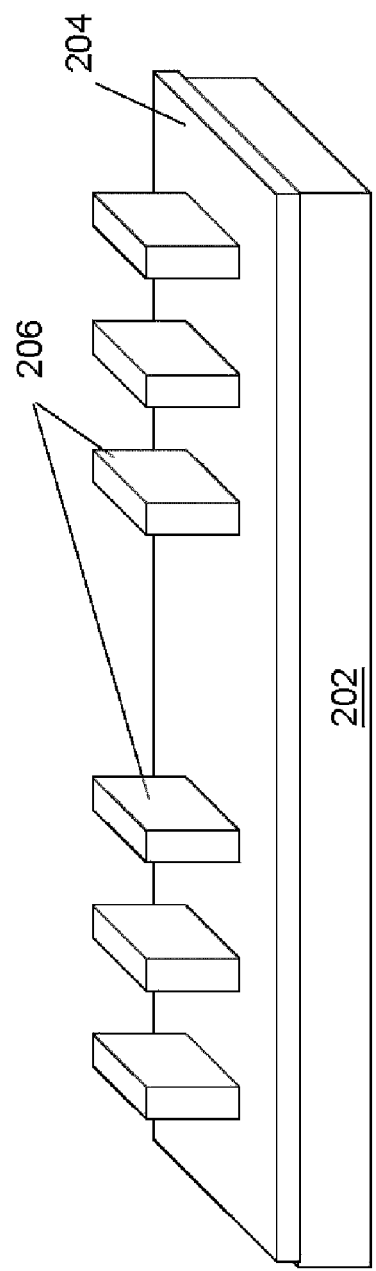

Referring to the example of FIGS. 2 and 3, a substrate 202 is provided. The substrate 202 may include silicon. An insulator layer 204 is disposed on the substrate 202. The substrate 202 and the insulator layer 204 may be components of an SOI substrate (e.g., including an overlying silicon layer patterned to form fins 206). The insulator layer 204 may include silicon oxide, sapphire, and/or other suitable insulating materials. The insulator layer 204 may be a buried oxide layer (BOX). A plurality of fins 206 is disposed on the insulator layer 204. In an embodiment, the plurality of fins 206 includes silicon. The plurality of fins 206 may be fabricated by patterning a silicon layer overlying the insulator layer 204 (e.g., an upper silicon layer of a silicon-insulator-silicon stack of an SOI substrate). The fins 206 may include a capping layer disposed on the fin. In an embodiment, the capping layer is a silicon layer.

The fins 206 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to etch fins 206 into the silicon layer. The fins 206 may be etched using reactive ion etch (RIE) and/or other suitable processes.

In an embodiment, the fins 206 are formed by double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

The method 100 then proceeds to step 104 where a layer including germanium is formed on each of the fins. The layer may include an epitaxial layer grown on the fins. The epitaxial layer may include SiGe. The epitaxial layer may be grown by a CMOS compatible epitaxial process. The epitaxial process may include chemical vapor deposition (CVD) technique such as vapor-phase epitaxy (VPE), and/or other suitable processes known in the art. The epitaxial process may use gaseous (or liquid) precursors, which interact with composition of the fins (e.g., silicon). In an embodiment, a low germanium concentration $Si_{1-x}Ge_x$, where x is between approximately 0.1 and 0.3, is provided. Referring to the example of FIGS. 4 and 5, an epitaxial layer 402 is grown on the fins 206. In an embodiment, the fins 206 are silicon and an epitaxial layer 402 includes SiGe. In an embodiment, the epitaxial layer 402 includes a low Ge concentration (e.g., $Si_{1-x}Ge_x$ where x is between approximately 0.1 and 0.3).

The method 100 then proceeds to step 106 where a germanium condensation process (Ge-condensation) is performed. The germanium condensation process transforms the fins provided in step 102, to fins including germanium (Ge-fins). In an embodiment, the Ge-condensation process transforms silicon fins to Ge-fins. It should be noted that the term Ge-fin as provided herein does not necessitate a fin of exclusively germanium (e.g., pure germanium).

The Ge-condensation process includes selectively oxidizing the layer including germanium and/or fins, described above with reference to steps 104 and 102, respectively. In an embodiment, the germanium condensation provides for substantially pure germanium fins. The Ge-condensation may include silicon preferential oxidation in a dry atmosphere including oxygen. In an embodiment, the oxidation is performed at a temperature of up to 1150 C, by way of example and not intended to be limiting. In an embodiment, silicon of the fins (provided in step 102) is consumed in the oxidation. Any silicon in the germanium layer (e.g., silicon of a SiGe epitaxial layer provided in step 104) may also be consumed in the oxidation. The oxidation may form a silicon oxide layer on the substrate. For example, the silicon oxide layer may be formed using the consumed silicon. The germanium may be condensed to the center of the structure and form fins including germanium. The time of the oxidation may be determined depending on the composition of germanium desired for the fin structure. The oxidation may occur in a plurality of steps. Therefore, step 106 provides for the transforming of Si-fins to Ge-fins.

Figure 6:
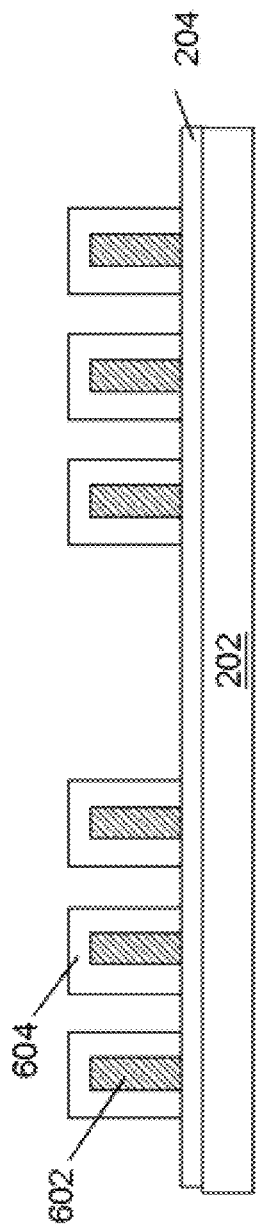
Figure 7:
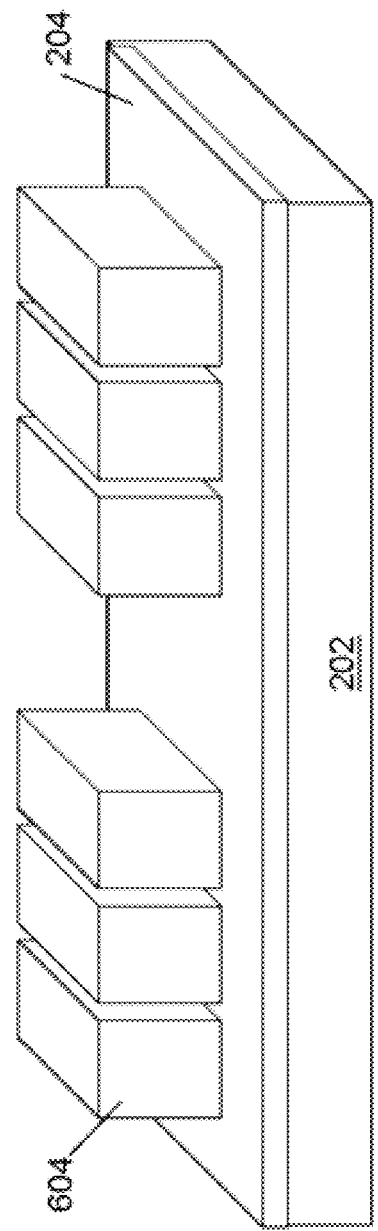

Referring to the example of FIGS. 6 and 7, fins 602 are formed. The fins 602 include germanium (e.g., Ge-fins). An oxidized layer 604 is formed around the fins 602. The oxidized layer includes silicon oxide. The oxidized layer 604 may be formed by oxidation. For example, during an oxidation process silicon of the epitaxial layer 402 and/of the fins 206, illustrated on FIGS. 4 and 5, may be consumed and form the oxidized layer 604. As the silicon is consumed, germanium from the epi layer 402 is transferred to the center of the structure to form fins 602.

The method 100 then proceeds to step 108 where the oxidized layer (e.g., formed by the Ge-condensation process) is removed from the substrate. The oxidized layer may be removed by suitable etching processes including wet etch, dry etch, plasma etch, and/or other suitable processes. In an embodiment, a wet etch including a diluted hydrofluoric acid (dHF) solution is used to remove the oxidized layer. The etching process may also remove a portion of the underlying insulator layer. Thus, a recess in the underlying insulator layer may be formed. Referring to the example of FIGS. 8 and 9, the oxidized layer 604 has been removed exposing the Ge-fins 602. The removal of the oxidized layer 604 creates recesses 802 in the insulator layer 204. Thus, a fin structure 806 is formed including an upper portion including Ge-fins 602 and a lower portion including an insulator portion 804. The insulator portion 804 is raised from the substrate (e.g., forms a fin) due the recesses 802. A channel of a FinFET device may be formed in the upper portion of the fin structure 806.

The method 100 may continue to provides steps fabricating other features of FinFET elements, including, for example, doping the fin structure, forming a gate structure including a gate dielectric and gate electrode on the fins, forming of source/drain regions, forming contact, interconnect structures, and/or other suitable processes and features.

Therefore, provided is a method 100 for forming a FinFET element having fins including germanium (e.g., Ge-fin) on a substrate. The method 100 uses CMOS compatible processes. The method 100 also allows for use of an SOI substrate. This removes the need to provide a germanium on insulator (GOI) substrate, which may provide issues in fabrication.

Figure 10:
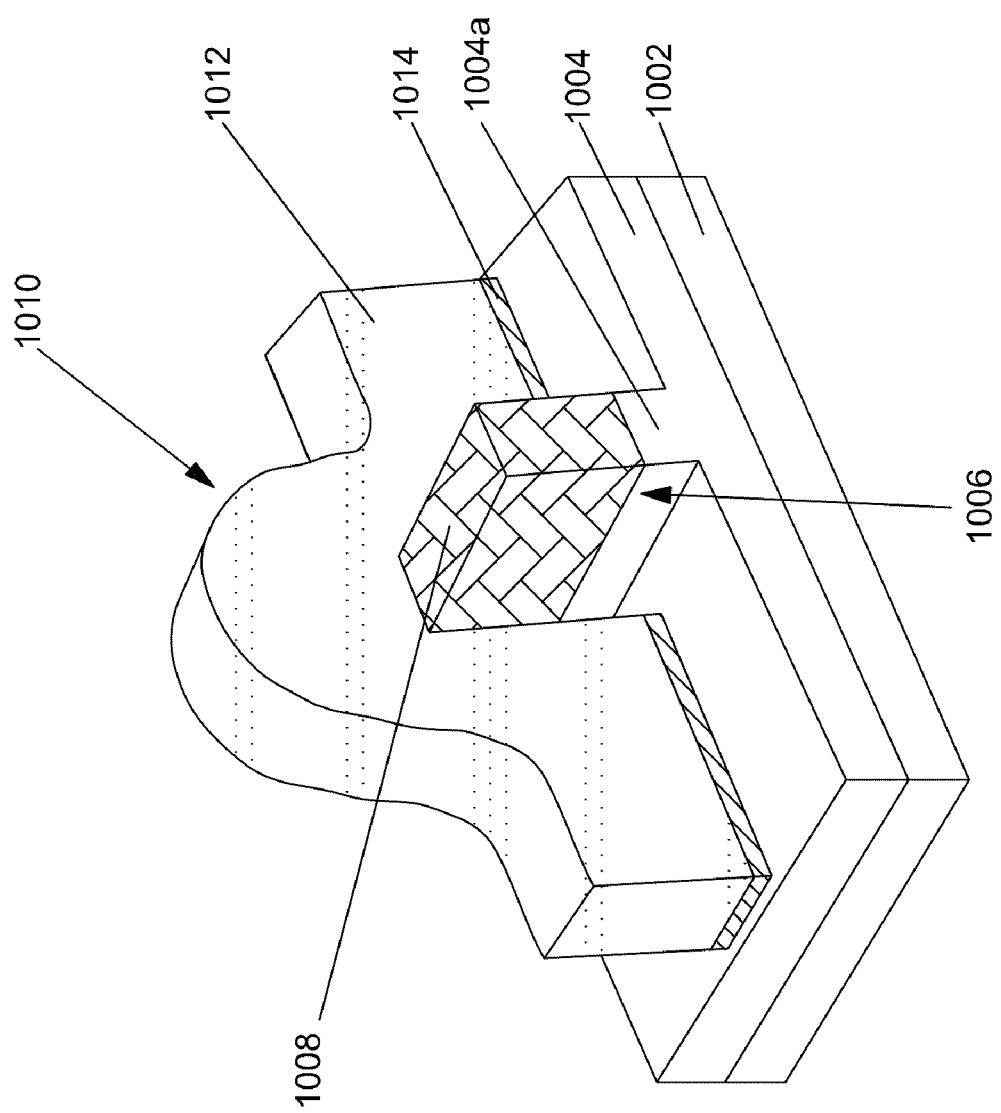
FIG. 10 is a perspective view illustrating an embodiment of a Ge-FinFET element.

Referring to FIG. 10, illustrated is an embodiment of a FinFET element 1000. The FinFET element 1000 may be formed using the method 100, described above with reference to FIG. 1, or a portion thereof. The FinFET element 1000 includes a substrate 1002, an insulator layer 1004, a fin structure 1006, and a gate structure 1010. In an embodiment, the substrate 1002 includes a silicon substrate. The substrate 1002 may be silicon in a crystalline structure. In other embodiments, the substrate 1002 may include other elementary semiconductors such as germanium, or include a compound semiconductor such as, silicon carbide, gallium arsenide, indium arsenide, and indium phosphide. In an embodiment, the substrate 1002 includes a silicon-on-insulator (SOI) substrate. The SOI substrate may be fabricated using separation by implantation of oxygen (SIMOX), wafer bonding, and/or other suitable methods. The substrate 1002 may include isolation regions, doped regions, and/or other features.

The insulator layer 1004 is disposed on the substrate 1002. The insulator layer 1004 may include silicon. In an embodiment, the insulator layer 1004 is silicon oxide. The insulator layer 1004 may be a buried oxide (BOX) layer. The insulator layer 1004 may be a component (e.g., layer) of an SOI substrate. The insulator layer 1004 may be formed using processes such as, implantation (e.g., SIMOX), oxidation, deposition, and/or suitable processes. The insulator layer 1004 includes a raised portion (fin) 1004a that is included in the fin structure 1006. The insulator fin portion 1004a may be formed by an etching process used to provide a Ge-fin 1008 of the fin structure 1006, for example, as described above with reference to step 108 of FIG. 1.

The fin structure 1006 includes an upper portion including the Ge-fin 1008 and a lower portion including the insulator fin portion 1004a. The Ge-fin 1008 may be formed by processes including providing a silicon-fin, growing a layer including germanium on the silicon-fin, and using a Ge-condensation process to provide Ge-fins. The Ge-fin 1008 may be formed using the method 100, or portion thereof.

The gate structure 1010 is formed on the fin structure 1008. The gate structure 1010 includes a gate dielectric layer 1014 and a gate electrode 1012. Numerous other layers may also be present, for example, capping layers, interface layers, spacer elements, and/or other suitable features. The gate dielectric layer 1014 may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer 1014 may be formed using processes such as, photolithography patterning, oxidation, deposition, etching, and/or other suitable processes. The gate electrode 1012 may include polysilicon, silicon-germanium, a metal including metal compounds such as, Mo, Cu, W, Ti, Ta, TiN, TaN, NiSi, CoSi, and/or other suitable conductive materials known in the art. The gate electrode 1012 may be formed using processes such as, physical vapor deposition (PVD), chemical vapor deposition (CVD), plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

The fin structure 1008, and in particular the upper portion including the Ge-fin 1008 may include a channel of the FinFET element 100. The fin structure 1006 may be doped to provide a suitable channel for an N-FinFET (NMOS device) or P-FinFET (PMOS device). The fin structure 1006, and in particular the upper portion including the Ge-fin 1008, may include suitable dopants such as, p-type dopants (e.g., boron) and/or n-type dopants (e.g., phosphorous). The fin structure 1006 may be doped using processes such as, ion implantation, diffusion, annealing, and/or other suitable processes.

The fin structure 1008 may include and/or be coupled to source and drain regions associated with the FinFET element 1000. The FinFET device including the FinFET element 1000 may be a device included in a microprocessor, memory cell, and/or other semiconductor devices.

Referring now to FIGS. 11, 12, 13, and 14 illustrated are examples of an embodiment of the method of FIG. 1. The examples of FIGS. 11, 12, 13, and 14 include a bulk silicon substrate and include many of the same or substantially similar steps as described above with reference to FIG. 1 and the examples of FIGS. 2-9. Referring to the example of FIG. 11, a substrate 1102 is provided. The substrate 1102 may be silicon in crystalline structure (e.g., a bulk silicon substrate). Fins 1104 (e.g., Si-fins) extend from the substrate 1102. The fins 1104 include silicon. The fins 1104 may be fabricated by using suitable process such as photolithography and etch. In an embodiment, the fins 1104 are etched from the substrate 1102 using dry etch or plasma processes. Shallow trench isolation (STI) structures 1106 surround the fins 1104. The STI structures 1106 may include any suitable insulating material.

Figure 12:
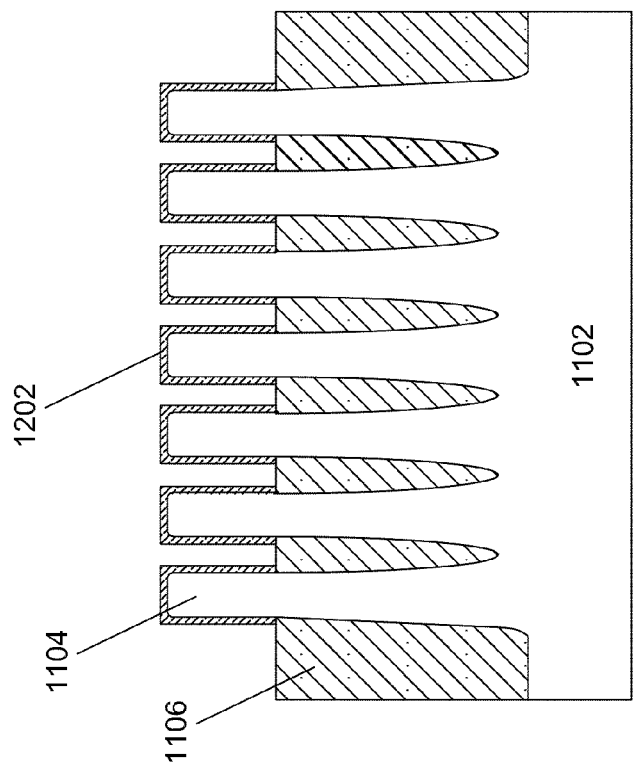
Figure 11:
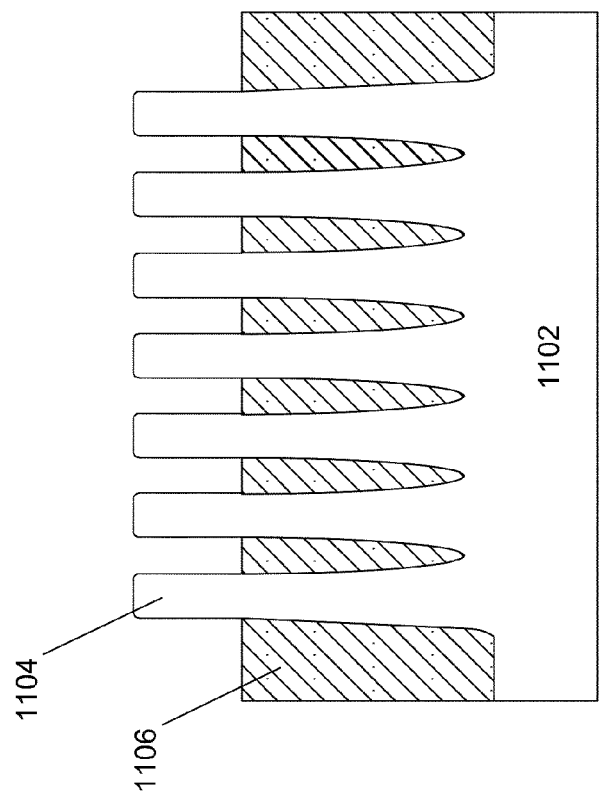

Referring to the example of FIG. 12, illustrated is an embodiment of step 104 of the method 100, described above with reference to FIG. 1. A layer 1202 is provided on the fins 1104. The layer 1202 includes germanium. In an embodiment, the layer 1202 is $Si_{1-x}Ge_x$, which may be substantially similar to as described above with reference to epitaxial layer described above with reference to step 104. In an embodiment, the layer 1202 is epitaxially grown.

Referring to the example of FIG. 13, illustrated is an embodiment of the step 106 of the method 100 using a bulk silicon substrate. A germanium condensation process is performed which forms Ge-fins 1302 with a silicon oxide layer (e.g., cap layer) 1304. In addition, a portion of the silicon fin 1104 is oxidized during the condensation process. This forms the oxidized segment 1306. The oxidized segments 1306 include silicon oxide. The germanium condensation process may be substantially similar to as described above with reference to FIG. 1.

Referring to the example of FIG. 14, an embodiment of the step 108 of the method 100 using a bulk silicon substrate is illustrated. In an embodiment, the cap layer 1304 is removed by a suitable wet etch process, however, other embodiments maybe possible. The oxidized segments 1306 may not be removed. Note that the Ge-fins 1302 are isolated from the remaining portion of the Si-fins 1104 by the oxidized segment 1306 (e.g., silicon oxide insulator).

The embodiment of the method may continue to form transistor features such as gate, source, and drains on or adjacent the formed Ge-fins 1302. One or more of these features is described in detail with reference to FIG. 10. Therefore, provided is a method of forming a Ge-FinFET element from a bulk silicon substrate.

Although only a few exemplary embodiments of this invention have been described in detail above, those skilled in the art will readily appreciate that many modifications are possible in the exemplary embodiments without material departing from the novel teachings and advantages of this disclosure.

What is claimed is:

1. A method of fabricating a FinFET element comprising:
providing a substrate;
forming a plurality of silicon fins on the substrate, wherein each of the plurality of fins has a first portion, a second portion underlying the first portion, and a third portion underlying the second portion;
growing a SiGe epitaxial layer on the silicon fins; and
performing a germanium condensation process, wherein the germanium condensation process includes:
transferring germanium from the epitaxial layer to the first portion of each of the silicon fins to form germanium fins (Ge-fins); and
oxidizing the second portion of each of the silicon fins during the transferring germanium, wherein the third portion of each of the plurality of silicon fins remains silicon.

2. The method of claim 1, wherein the substrate is a silicon substrate.

3. The method of claim 1, further comprising:
forming a gate structure overlying the Ge-fins.

4. The method of claim 1, wherein the germanium condensation process forms a silicon oxide layer on the first portion of the plurality of silicon fins.

5. The method of claim 4, wherein the silicon oxide layer is removed by a wet etch process.

6. The method of claim 5, wherein the substrate includes an SOI substrate, and the wet etch removes a portion of an insulator layer of the SOI substrate.

7. A method of fabricating a semiconductor device, comprising:
providing a substrate;
forming a silicon fin on the substrate;
forming a SiGe layer on the silicon fin;
transforming a first portion of the silicon fin to a germanium fin, wherein the transforming includes performing an oxidation to consume silicon of the silicon fin, and wherein the consumed silicon forms a silicon oxide layer on the germanium fin; and
oxidizing a second portion of the silicon fin underlying the first portion of the silicon fin during the transforming the first portion of the silicon fin to a germanium fin.

8. The method of claim 7, wherein the forming the silicon fin includes etching a silicon layer of the substrate.

9. The method of claim 7, wherein the substrate is a silicon-on-insulator (SOI) substrate.

10. The method of claim 7, further comprising:
forming an insulator layer on the substrate.

11. The method of claim 7, wherein the forming the SiGe layer includes growing a SiGe epitaxial layer.

12. The method of claim 7, wherein the SiGe layer includes a composition of $Si_{1-x}Ge_x$ where x is between approximately 0.1 and 0.3.

13. The method of claim 7, further comprising:
removing the silicon oxide layer formed by the oxidation.

14. The method of claim 7, wherein the oxidation includes oxidation in a dry $O_2$ atmosphere.

15. The method of claim 7, wherein the oxidation includes oxidation until the fin is substantially pure germanium.

* * * * *